United States Patent
Wong

(10) Patent No.: US 6,363,008 B1
(45) Date of Patent: Mar. 26, 2002

(54) MULTI-BIT-CELL NON-VOLATILE MEMORY WITH MAXIMIZED DATA CAPACITY

(75) Inventor: Sau-Ching Wong, Hillsborough, CA (US)

(73) Assignee: Multi Level Memory Technology, San Jose, CA (US)

(*) Notice: Subject to any disclaimer, the term of this patent is extended or adjusted under 35 U.S.C. 154(b) by 0 days.

(21) Appl. No.: 09/505,519

(22) Filed: Feb. 17, 2000

(51) Int. Cl.⁷ ............................................. G11C 16/04
(52) U.S. Cl. ........................... 365/185.03; 365/185.05; 365/189.12; 365/230.03
(58) Field of Search ................... 365/185.03, 189.05, 365/189.12, 230.03, 189.03

(56) References Cited

U.S. PATENT DOCUMENTS

| | | |
|---|---|---|
| 5,043,940 A | 8/1991 | Harari |
| 5,095,344 A | 3/1992 | Harari |
| 5,097,445 A * | 3/1992 | Yamauchi .................... 365/195 |
| 5,163,021 A | 11/1992 | Mehrotra et al. |
| 5,172,338 A | 12/1992 | Mehrotra et al. |
| 5,239,506 A | 8/1993 | Fazio et al. |
| 5,262,984 A | 11/1993 | Noguchi et al. |
| 5,293,560 A | 3/1994 | Harari |
| 5,371,702 A | 12/1994 | Nakai et al. |
| 5,475,693 A | 12/1995 | Christopherson et al. |
| 5,485,422 A | 1/1996 | Baue et al. |
| 5,504,760 A | 4/1996 | Harari et al. |
| 5,508,958 A | 4/1996 | Fazio et al. |
| 5,509,134 A * | 4/1996 | Fandrich et al. ........ 365/189.05 |
| 5,511,022 A | 4/1996 | Yim et al. |
| 5,541,886 A * | 6/1996 | Hasbun .................. 365/230.01 |
| 5,554,867 A | 9/1996 | Ajika et al. |
| 5,574,879 A | 11/1996 | Wells et al. |
| 5,659,550 A | 8/1997 | Mehrotra et al. |
| 5,680,341 A | 10/1997 | Wong et al. |
| 5,682,352 A | 10/1997 | Wong et al. |
| 5,694,356 A | 12/1997 | Wong et al. |
| 5,745,409 A | 4/1998 | Wong et al. |
| 5,748,533 A | 5/1998 | Dunlap et al. |
| 5,748,534 A | 5/1998 | Dunlap et al. |
| 5,801,980 A | 9/1998 | Wong et al. |
| 5,802,553 A | 9/1998 | Robinson et al. |
| 5,815,425 A | 9/1998 | Wong et al. |
| 5,818,757 A | 10/1998 | So et al. |
| 5,828,616 A | 10/1998 | Bauer et al. |

(List continued on next page.)

Primary Examiner—Son T. Dinh
(74) Attorney, Agent, or Firm—David T. Millers

(57) ABSTRACT

A multiple-bit-per-cell memory includes multiple memory arrays, where the number of bits stored per cell is separately set for each of the memory arrays. Memory arrays that testing proves are accurate when writing, storing, and reading a larger number of bits per cell are set to store more bits per cell, and memory arrays that cannot accurately write, store, or read as many bits per cell are set to store fewer bits per cell. Accordingly, the setting of the numbers of bits per cell for the respective memory arrays can maximize the capacity of a memory when some arrays perform better than expected. When the memory arrays on average perform worse than expected, the setting of the numbers of bits per cell salvage the memory device even if the memory is unable to provide the total expected memory capacity. One implementation of the memory includes a register for the settings of the memory arrays and one or more analog/multi-level write and read circuits. One or more converters convert between the analog and digital signals where the digital signals contain a number of bits selected according to a memory array being accessed. A data buffer between the arrays and a data input/output interface collects data for conversion between the variable data sizes used in the memory and standard size data units input and output from the memory.

30 Claims, 5 Drawing Sheets

U.S. PATENT DOCUMENTS

| | | |
|---|---|---|
| 5,847,992 A | 12/1998 | Tanaka et al. |
| 5,859,795 A | 1/1999 | Rolandi |
| 5,862,074 A | 1/1999 | Park |
| 5,877,986 A | 3/1999 | Harari et al. |
| 5,880,996 A * | 3/1999 | Roohparvar ........... 365/185.33 |
| 5,896,340 A | 4/1999 | Wong et al. |
| 5,909,387 A | 6/1999 | Wong et al. |
| 5,909,449 A | 6/1999 | So et al. |
| 5,912,846 A * | 6/1999 | Taylor ................... 365/189.05 |
| 5,923,585 A | 7/1999 | Wong et al. |
| 5,943,283 A | 8/1999 | Wong et al. |
| 5,949,716 A | 9/1999 | Wong et al. |
| 5,969,986 A | 10/1999 | Wong et al. |
| 5,970,012 A | 10/1999 | Takeshima |
| 5,986,929 A | 11/1999 | Sugiura et al. |
| 5,999,445 A | 12/1999 | Rolandi et al. |
| 6,011,741 A | 1/2000 | Wallace et al. |
| 6,016,530 A | 1/2000 | Auclair et al. |
| 6,038,166 A | 3/2000 | Wong |
| 6,055,181 A | 4/2000 | Tanaka et al. |
| 6,058,060 A | 5/2000 | Wong |
| 6,078,526 A | 6/2000 | Mitani |
| 6,091,631 A | 7/2000 | Kucera et al. |
| 6,094,368 A | 7/2000 | Wong |
| 6,097,637 A | 8/2000 | Bauer et al. |
| 6,122,193 A | 9/2000 | Shibata et al. |
| 6,128,675 A | 10/2000 | Ko |
| 6,134,141 A | 10/2000 | Wong |
| 6,134,143 A | 10/2000 | Norman |
| 6,134,145 A | 10/2000 | Wong |
| 6,137,719 A | 10/2000 | Tsuruda et al. |
| 6,149,316 A | 11/2000 | Harrari et al. |
| 6,151,246 A | 11/2000 | So et al. |
| 6,160,739 A | 12/2000 | Wong |
| 6,208,542 B1 | 3/2001 | Wang |
| 6,219,282 B1 | 4/2001 | Tanaka |
| 6,222,762 B1 | 4/2001 | Guterman |
| 6,233,175 B1 | 5/2001 | Wang et al. |
| 6,233,717 B1 | 5/2001 | Choi |
| 6,236,081 B1 | 5/2001 | Fukumoto |

* cited by examiner

| (N=5) MEMORY ARRAY 141 | (N=4) MEMORY ARRAY 142 | (N=4) MEMORY ARRAY 143 | (N=4) MEMORY ARRAY 144 |
|---|---|---|---|
| (N=4) MEMORY ARRAY 145 | (N=3) MEMORY ARRAY 146 | (N=4) MEMORY ARRAY 147 | (N=3) MEMORY ARRAY 148 |
| (N=4) MEMORY ARRAY 149 | (N=4) MEMORY ARRAY 150 | (N=4) MEMORY ARRAY 151 | (N=4) MEMORY ARRAY 152 |
| (N=4) MEMORY ARRAY 153 | (N=4) MEMORY ARRAY 154 | (N=5) MEMORY ARRAY 155 | (N=4) MEMORY ARRAY 156 |

| (N=3) MEMORY ARRAY 161 | (N=3) MEMORY ARRAY 162 | (N=4) MEMORY ARRAY 163 | (N=3) MEMORY ARRAY 164 |
|---|---|---|---|
| (N=4) MEMORY ARRAY 165 | (N=3) MEMORY ARRAY 166 | (N=3) MEMORY ARRAY 167 | (N=1) MEMORY ARRAY 168 |
| (N=2) MEMORY ARRAY 169 | (N=4) MEMORY ARRAY 170 | (N=1) MEMORY ARRAY 171 | (N=2) MEMORY ARRAY 172 |
| (N=3) MEMORY ARRAY 173 | (N=3) MEMORY ARRAY 174 | (N=3) MEMORY ARRAY 175 | (N=4) MEMORY ARRAY 176 |

| (N=4) MEMORY ARRAY 181 | (N=4) MEMORY ARRAY 182 | (N=4) MEMORY ARRAY 183 | (N=4) MEMORY ARRAY 184 |
|---|---|---|---|
| (N=0) MEMORY ARRAY 185 | (N=4) MEMORY ARRAY 186 | (N=4) MEMORY ARRAY 187 | (N=4) MEMORY ARRAY 188 |
| (N=4) MEMORY ARRAY 189 | (N=4) MEMORY ARRAY 190 | (N=4) MEMORY ARRAY 191 | (N=4) MEMORY ARRAY 192 |
| (N=4) MEMORY ARRAY 193 | (N=4) MEMORY ARRAY 194 | (N=4) MEMORY ARRAY 195 | (N=4) MEMORY ARRAY 196 |

MULTI-BIT-CELL NON-VOLATILE MEMORY WITH MAXIMIZED DATA CAPACITY

BACKGROUND

1. Field of the Invention

This invention relates to multi-bit-per-cell non-volatile memory and to methods for classifying and operating such memories for maximum data capacity.

2. Description of Related Art

A traditional semiconductor memory device such as an SRAM, DRAM, ROM, EPROM, Flash, EEPROM, or NVRAM has a data capacity (e.g., 1 Mbit or 1 Gbit) that is pre-determined by the memory device's design. For a multi-bit-per-cell Flash memory, each design/mask-set fixes both the number N of bits stored per cell and the total storage capacity of the Flash memory. For example, a memory designed to store four bits per memory cell and include 64 Meg (1024×1024) cells has a data capacity of 256 Mbits. This data capacity is fixed for the lifetime of the memory. If during manufacturing or operation the memory has fewer than 64 Meg cells that are capable of storing four bits per cell, the memory is defective and must be discarded during manufacture or replaced during operation. This reduces the yield and/or the usable life of multi-bit-per cell memories.

In the design of multi-bit-per-cell Flash memory, there is usually a trade-off between the number of bits N stored per cell and the error rate or data integrity/reliability that the memory provides. Generally, the number N of bits that can be stored per cell depends on the usable range of threshold voltages representing data values and the separation between consecutive threshold voltages that represent different data values. For current memory cell designs, the available threshold voltage range is less than about 5 volts. However, an infinite number of different threshold voltage levels are possible if read and write circuits are perfectly accurate and perfectly calibrated and the memory cells did not experience any threshold voltage drift. In an actual device, several factors limit the minimum separation between distinct threshold voltage levels. In particular, minimum separation must include a margin for charge-gain and charge-loss effects and data retention and endurance effects that change the threshold voltage of memory cells. Additionally, the write and read processes have limited accuracy, which can be affected by parasitic effects across the memory array, such as source line, word line, or bit line resistance, capacitance, and RC effects. Process variations can also lead to unequal performance and reactions for read and write circuits and memory cells. Sensitivities to power supply voltage and temperature provide transient effects that disturb the accuracy with which threshold voltages are read or written. A design for a multi-bit-per-cell memory must account for all of these factors and select a number N of bits that can be stored with a desired reliability.

Assuming a threshold voltage dynamic range of 3.2 V, conventional binary or 1-bit-per-cell Flash memory (N=1) has 2 levels with a threshold voltage window about 1.6 V wide for each level. A two-bit-per-cell memory (N=2) has four levels and an 800 mV wide window for each level. A four-bit-per-cell memory (N=4) has sixteen levels and a 200 mV wide window for each level. As the number of bits per cell increases, the threshold voltage window for each level narrows, and the capability of read and write circuits to distinguish between levels must correspondingly increase if reliability is to be maintained. In addition, the potential for data errors caused by small drifts in the threshold voltages increases as the window for each level narrows. Accordingly, threshold voltage drift must be more tightly controlled as the number N of bits stored per memory cell increases.

Generally, achieving the same reliability or error rate with a two-bit-per-cell memory as with a binary memory is difficult because a fraction of the memory cells in high density memories normally fail to meet all of the stringent requirements for reliably storing two bits of data. Achieving the same reliability with a three- or four-bit-per-cell memory is even more difficult. Further, non-volatile memories such as Flash memories have established quality expectations of minimum data retention time (about 10 years), minimum endurance (>100,000 write/erase cycles), and operability with supply voltage variations (±10%), and temperature variation (0 to 70° C.). The industry established expectations are based on the binary memory architecture and are more difficult to achieve in a multi-bit-per-cell memory.

Several crucial improvements of a proven 1-bit-per-cell memory design are generally required to achieve an N-bit-per-cell memory design with acceptable reliability. The read and write circuits must be modified to significantly improve the threshold voltage write and read accuracy. Assuming that data retention, charge-gain and charge-loss effects are intrinsic and cannot be totally eliminated, extensive tracking or reference circuitry must be added to reduce sensitivities to disturb and aging effects and to supply voltage, temperature, and process variations. Memory array architectures and memory cell and memory cell/array layouts must be tailored to minimize cell-to-cell, array-to-array, and die-to-die variations and disturb and endurance effects.

SUMMARY

In accordance with the invention, a memory device includes multiple memory arrays. Each memory array is operable in multiple modes with each mode corresponding to a different number of bits stored per memory cell in the array. The number of bits stored per cell in each array can be selected based on results of a wafer-sort or a package level test and extrapolation based on a burn-in/life test. The memory device provides lower cost per bit of storage because the memory device can maximize the effective data storage of each array and can salvage memory devices that would otherwise be classified as defective when one or more of the arrays cannot provide a desired storage density. The memory device is particularly useful for mass data storage applications that store serial data because a serial data stream can be broken into data units of variable widths according to the number of bits Nj stored in each memory cell of the receiving array j.

The memory devices can be packaged with a minimum guaranteed memory density with a fixed N across all memory arrays, or with an option to select a highest possible memory density with a different number of bits stored in at least some of the memory arrays. The fixed N option may simplify random memory accesses, but the variable N provides higher data density. For the high-density option, one array may operate as multi-bit-per-cell storage (N>1), while a second array operates a binary storage (N=1) and a third array is disabled (N=0). An on-chip electronic signature can indicate the combined or total (effective) memory density of the device. The package labeling also indicates the total capacity, and the selling price for each device can then be set individually depending on the capacity.

One embodiment of the invention is a manufacturing method that includes: fabricating an integrated circuit memory device that includes a plurality of memory units; testing each memory unit; and setting each memory unit j for storage of Nj bits per cell. Each memory unit has a design capacity to store a maximum of Nmax bits per memory cell, but for each memory unit j, the setting Nj depends on results of the extensive testing. A total storage capacity of the integrated circuit memory device depends on the settings of the memory units. The design of the memory units provides an expected capacity to store Nav bits per memory unit, which typically is less than Nmax. When testing indicates one of the memory units can accurately write, store, and read more than Nav bits per memory cell, the setting causes that memory unit to store more than Nav bits per cell. When testing indicates one of the memory units cannot accurately write, store, or read Nav bits per memory cell, the setting causes that memory unit to store fewer than Nav bits per cell. Accordingly, memory chips of the same design will end up with different memory capacities according to actual capabilities achieved in the manufacturing and testing processes. This allows production of more value memory chips having higher than expected memory capacity and higher yields of operable chips because memory chips having some memory arrays that do not meet expectations can still be salvaged as valuable devices.

Another embodiment of the invention is a memory including multiple memory arrays, a data input/output interface, and a data buffer. The memory arrays have the same design, but among the memory arrays are a first memory array and a second memory array capable of different levels of storage performance. The first memory array is configured to store N1 bits per memory cell, and the second memory array is configured to store N2 bits per memory cell, where N2 is less than N1 and greater than zero. The data buffer is between the input/output interface and the plurality of memory arrays and collects data read from or to be written to the plurality of memory cells. Accordingly, the data buffer converts between the variable data widths used in the memory, and standard data widths for external circuits.

An externally accessible register can store the settings of the numbers of bits store per cell in the arrays. External accessibility allows a user to examine or change the number of bits stored per cell, and thus allows a trade-off between data accuracy and data capacity. Such changes can, for example, maintain a desired level of data accuracy as the memory ages or decrease accuracy to increase memory capacity in error-tolerant applications, such as music or image storage. These techniques are also fully compatible with error correction schemes such as Reed-Solomon coding so that the decreased accuracy associated with the increased memory capacity does not generate any effective (i.e., uncorrectable) errors.

One implementation of the memory includes write and read circuits having a maximum capacity to write and read Nmax-bit digital values. Each digital value corresponds to a threshold voltage of a corresponding memory cell, but some of the bits of the Nmax-bit values may be inaccurate or vary from one memory access to the next. Converters convert data signals according to the accuracy of the memory arrays being accessed.

Yet another embodiment of the invention is a method for using an integrated circuit memory. The method includes: selecting a first memory array in the integrated circuit memory; identifying a number N1 of bits per cell for the first memory array; and accessing a first selected memory cell in the first memory array. The access of the first selected memory cell transfers N1 bits of data. The method further includes: selecting a second memory array in the integrated circuit memory; identifying a number N2 of bits per cell for the second memory array, wherein N2 differs from N1; and accessing a second selected memory cell in the second memory array. The access of the second selected memory cell transfers N2 bits of data. Accordingly, the memory uses internal accesses of different effective data widths per memory cell. Each access can be a write or read operation, and a register can store settings for identification of the numbers of bits per cell accessed in corresponding memory arrays.

BRIEF DESCRIPTION OF THE DRAWINGS

FIGS. 1A, 1B, 1C, 1D, and 1E show memories of identical design that in accordance with the invention are graded at different data capacities.

Use of the same reference symbols in different figures indicates similar or identical items.

DETAILED DESCRIPTION

Figure 1A:
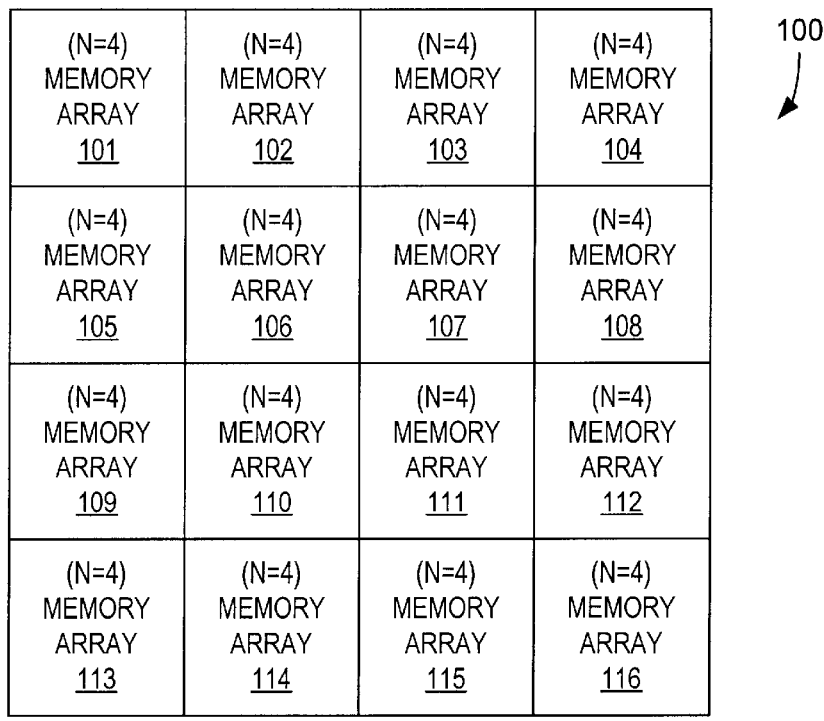

In accordance with an aspect of the invention, a multi-bit-per-cell memory includes M memory arrays with each memory array j (for j between 1 and M) storing Nj bits per memory cell. Each number Nj depends on the capability of the respective memory array j, which may vary according to variations in an integrated circuit manufacturing process. The values Nj can range between a minimum of zero, indicating the memory array is defective or otherwise not used, to Nmax, which is the maximum number of bits that the read and write circuits can provide when an array performs optimally. The memory architecture is particularly useful for mass data storage that stores blocks of data or a serial data stream at sequential memory addresses. In particular, for writing, a serial data stream of a large data file is broken into data units according to the number of bits that can be written in each memory cell. Different size data units are written in the memory arrays having different numbers of bits per memory cell. Blocks of data are partitioned into data blocks having sizes Nj×Ns where Nj is the number of bits per memory cell and Ns is the number of memory cells per sector in a memory array storing the data block. When reading the serial data or a data block, the data can be reassembled into data units having a conventional size such as 8, 16, 32, or 64 bits wide per data unit.

FIG. 1 is a block diagram of a memory device 100, which includes multiple memory arrays 101 through 116. Each array 101 through 116 includes a fixed number of memory cells, for example, one Meg of memory cells, and is configurable to select the number or bits stored per memory cell. Each of the arrays has associated write, read, and control circuits such as described further below.

The write circuit is designed to write a multi-bit value in a memory cell by setting a threshold voltage of the memory cell to a level corresponding to the value being written. More specifically, the write circuit accepts a multi-bit digital value having up to Nmax bits and programs a memory cell selected for a write operation to one of $2^{Nmax}$ possible levels. In practice, the write circuit may lack the precision to accurately set threshold voltages at $2^{Nmax}$ distinct levels. More particularly, when writing the same Nmax-bit value to two different memory cells, the two memory cells may end with different threshold voltages that the read circuit reads as different Nmax-bit values. Additionally, the memory array or specific memory cells in the array may be such that over the life of memory device 100, the threshold voltage drifts, for example, due to charge loss, charge gain, or disturbances during operation of the memory. The drift can take the threshold voltage of a memory cell from one of the $2^{Nmax}$ levels to another of the levels. To avoid inaccurate writing or changes in stored values, the number Nj of bits stored per memory cell in an array generally must be smaller than Nmax.

The read circuit generates a multi-bit digital value according to the threshold voltage of a memory cell selected for reading. The multi-bit digital value includes Nmax bits, but the one or more of the least significant bits may be unreliable (and therefore unused). More specifically, one or more of the least significant bits may differ during different readings of the same cell through out the life of the memory device 100. Again, to avoid inaccuracies in read values, the number Nj of bits stored (and read) per memory cell in an array generally is smaller than Nmax.

Input and output ports of each array are configurable to select a number of input bits Nj used for a write operation or output after a read operation. Testing of an array indicates the optimal number Nj of bits per cell for the array. Generally, the number Nj is the maximum number of bits that can be accurately written and read from individual memory cells in the array. Programming of the input and output ports can be, for example, by way of laser fuses, poly fuses, or anti-fuse or using non-volatile memory elements to store the number Nj or equivalent repair information. Such fuses and similar structures are commonly employed for repair operations using redundant memory cells in conventional memory. A write circuit still uses an Nmax-bit input value, but the value being written in a memory cell only provides Nj valid bits, typically the Nj most significant bits of the Nmax-bit input value. The least significant bits can be ignored or set to a fixed value (e.g., all 0 or all 1) or to a value that maximizes the distance between the $2^{Nj}$ levels required for when representing Nj-bit values. The read circuit determines an Nmax-bit read value from the threshold voltage of a selected memory cell and can ignore or truncate the least significant bits of the Nmax-bit value or perform rounding on the Nmax-bit values to generate an N-bit output value.

In an exemplary embodiment of the invention, the maximum number Nmax of input and output bits of the write and read circuits is eight, but the typical memory array in an actual integrated circuit only permits accurate writing and reading of four bits per memory cell. In the memory 100, each of memory arrays 101 to 116 performs as expected and is capable over accurately writing and reading four bits of data per memory cell. Accordingly, the total memory capacity of memory 100 is 64 Mbits (16 arrays×4 bits/cell×1 Meg cells/array).

Figure 1B:
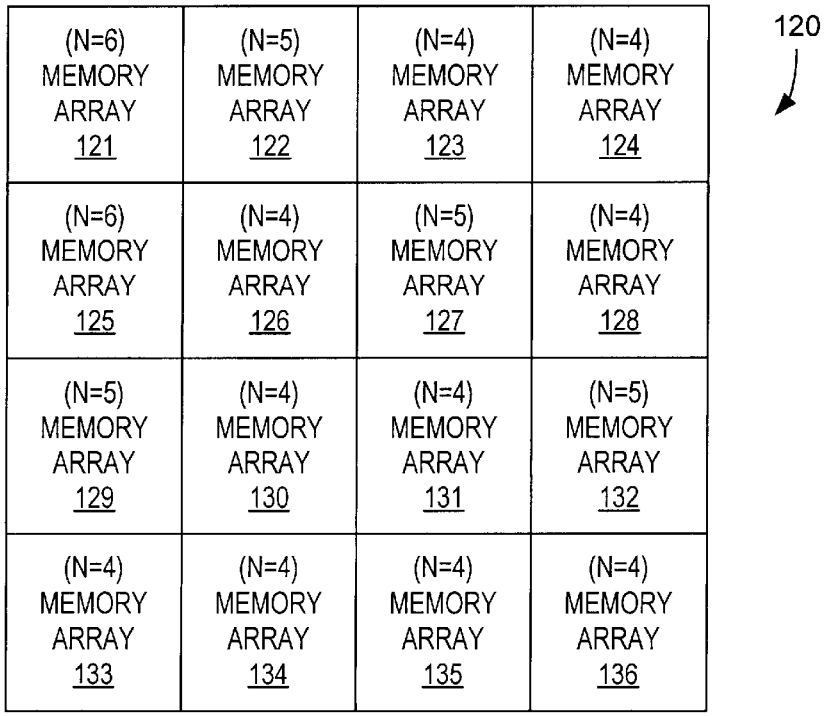

FIG. 1B shows a memory 120 having the same design as memory 100. Memory 120 differs from memory 100 in that some memory arrays 121, 122, 125, 127, 129, and 132 perform better than expected. Other memory arrays 123, 124, 126, 127, 128, 130, 131, 133, 134, 135, and 136 in memory 120 perform as expected. In particular, memory arrays 121 and 125 are capable of writing and reading 6-bit values with the desired reliability. Memory arrays 122, 127, 129, and 132 can write and read 5-bit values with the desired reliability. Memory arrays 123, 124, 126, 127, 128, 130, 131, 133, 134, 135, and 136 can write and read 4-bit values with the desired reliability. During manufacture, a test determines the capabilities of the memory arrays 121 to 136 and programming of the I/O circuitry of memory 120 selects the numbers of bits for the arrays as given above. As a result, the total memory capacity of the memory array 120 is 72 Mbits {(2 arrays×6 bits/cell+4 arrays×5 bits/cell+10 arrays×4 bits/cell)×1 Meg cells/array}. Accordingly, a multi-bit-per-cell memory design expected to work with 4 bits per cell for a total memory capacity of 64 Mbits can actually provide memory devices with higher capacity (e.g., 72 Mbits), which presumably would command a higher market price. On the other hand, the higher capacity devices can be sold at the same price as the other available 64 Mbit devices, and provide the buyers with the option of more memory capacity.

Memory arrays may also test and perform worse than expected. FIG. 1C shows a memory 140 of the same design as memories 100 and 120 of FIGS. 1A and 1B. In memory 140, arrays 141 and 155 perform better than average and can accurately write, store, and read 5 bits per memory cell. Memory arrays 142–145, 147, 149–154, and 156 perform as expected and can accurately, write, store, and read 4 bits per memory cell. However, memory arrays 146 and 148 perform worse than expected and can accurately, write, store, and read only 3 bits per memory cell. This memory would be defective and discarded in a memory architecture that demands every array to store the four bits per memory cell. However, better performing arrays of the memory 140 compensate for worse performing arrays of memory 140, and memory 140 has a total storage capacity of 64 Mbits {(2 arrays×5 bits/cell+12 arrays×4 bits/cell+2 arrays×3 bits/cell)×1 Meg cells/array}. Accordingly, the variable setting of the number of bits per memory cell allows a higher yield of operable devices having the desired density and reliability.

Even when the arrays on average perform worse than expected, the variable setting of the number of bits per cell can salvage a memory device. FIG. 1D shows a memory device 160 having the same design as memory 100 of FIG. 1, but testing indicates that arrays of memory device 160 on average perform worse than expected. In memory 160, memory arrays 163, 165, 170, and 176 perform as expected and can accurately, write, store, and read four bits per memory cell. The remaining memory arrays perform worse than expected. Memory arrays 161, 162, 164, 166, 167, 173, 174, and 175 can accurately, write, store, and read three bits per memory cell. Memory arrays 169 and 172 can accurately, write, store, and read two bits per memory cell. Memory arrays 168 and 171 can only store one bit per memory cell and effectively operate as binary memory arrays. Accordingly, the total memory capacity of memory 160 is 46 Mbits {(4 arrays×4 bits/cell+8 arrays×3 bits/cell+2 arrays×2 bits/cell+2 arrays×1 bit/cell)×1 Meg cells/array}. Accordingly, instead of discarding memory 160 as being unable to achieve the desired capacity of 64 Mbits, the memory 160 is an economically valuable memory device.

Another feature of the inventions is that a memory device can be economically valuable even if one or more arrays are defective and unable to store any data. FIG. 1E shows a memory device 180 in which one memory array 185 is defective but the other arrays 181 to 184 and 186 to 196 perform as expected and are capable of reliably writing, storing, and reading four bits per cell. The defect in memory array 185 is an unrepairable defect that makes the array unable to store any data in at least some of the addresses of the array. Memory 180 is programmed or configured to store four bits per cell in arrays 181 to 184 and 186 to 196 and no data (zero bits per cell) in array 185. Accordingly, the total capacity of memory 180 is 60 Mbits, and memory 180 is an economically valuable device instead of a device that must be discarded.

Figure 2:
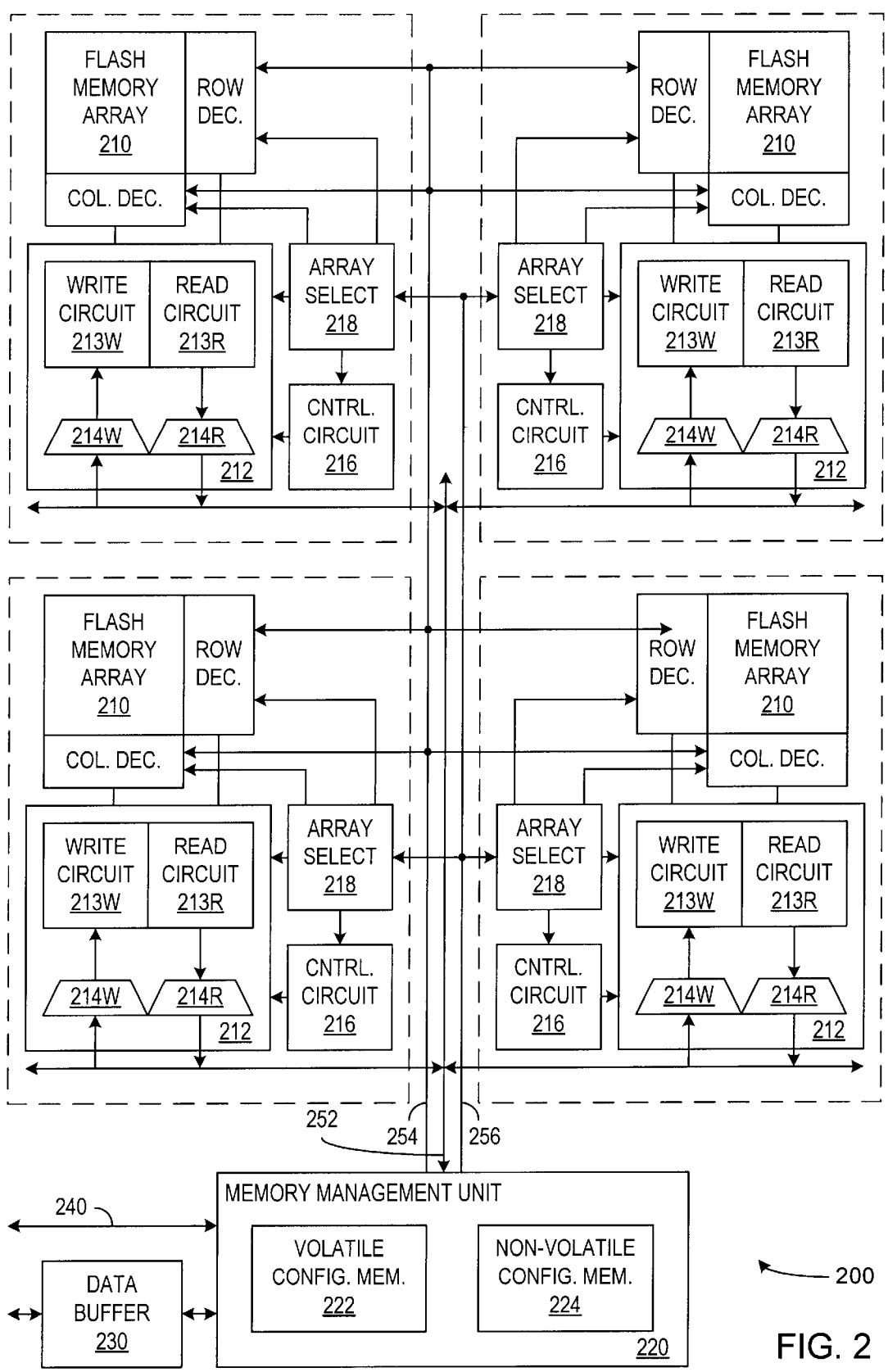
FIG. 2 shows a block diagram or a memory device in accordance with an embodiment of the invention.

FIG. 2 is a block diagram of a multi-bit-per-cell Flash memory 200 in accordance with an embodiment of the invention. Memory 200 includes multiple memory arrays 210. Each array 210 includes rows and columns of memory cells. Each memory cell can be a conventional Flash memory cell (e.g., a floating gate transistor), an EEPROM cell, or an EPROM cell. Row lines (not shown) connect a row decoder to the control gates of memory cells in the rows of memory array 210. Column lines (not shown) connect sense amplifiers and a column decoder to drains of memory cells in the columns of memory array 210. Each array 210 is further divided into erasable sectors, and a source line connects to the sources of memory cells in an associated sector. The implementation of each array 210 and the associated row and column decoders can be conventional for multi-bit-per-cell memory. Memory arrays 210 can each consist of multiple segmented memory banks (not shown), each bank containing multiple sectors. The maximum number of memory cells on a bit-line segment depends on the maximum tolerable program disturb characteristics of the memory cells.

Also associated with each array 210 are multi-bit-per-cell write/read circuit 212, a control circuit 216, and an array selection circuit 218. A data bus 252, an address bus 254, and an array select bus 256 respectively provide data signals, address signals, and array select signals from a memory management unit 220 to the circuitry associated with arrays 210. An external control interface 240 provides control signals for operation of memory 200, and memory data buffer 230 temporarily stores data input to memory 200 or until output from memory 200.

For one embodiment of a write operation; data buffer 230 collects externally input data until data buffer 230 contains enough data to fill an entire sector of a selected memory array. The amount of data stored in a sector of a memory array j depends on the number of memory cells in the sector and the number Nj of bits stored per memory cell. Buffer 230 would normally include at least twice the capacity of a sector in a memory array that can store the maximum number Nmax of bits per memory cell. With this configuration, one portion of buffer 230 can provide the data being written to a sector, while another portion of buffer 230 continues to collect data for writing in the next selected sector. Alternatively, write operations are not required to be on a per sector basis and can begin when buffer 230 contains Nj bits of data to be written.

Memory management unit 220 generates array select signals to select one of the arrays 210 for the write operation. Address signals from the memory management unit 220 then select an erased sector in the array and a selected memory cell in the selected sector. Memory management unit 220 then retrieves an Nj-bit value from data buffer 230, where Nj is the number of bits stored per cell in the selected array. An optional volatile configuration memory 222, which contains volatile memory such as SRAM, can store the number Nj for memory management unit 220. Volatile configuration memory 222 permits configuration at power up of memory 200 and permits a user to override previous selections of the bit limits Nj. For example, at power up, values Nj can be read from non-volatile configuration memory 224 and stored in volatile configuration memory 222. Configuration memory 224 can be a ROM or an electrically programmable non-volatile memory such as Flash memory. A ROM can be programmed, for example, by cutting fuses during manufacture and testing of memory 200. Configuration memory 224 can be a separate array or may consist of memory cells scattered in the arrays 210 if configuration memory 224 uses Flash memory cells. Volatile configuration register 222 can be omitted if values Nj are read directly from non-volatile configuration memory 224 when required. Alternatively, non-volatile configuration memory 224 can be omitted, giving the user complete responsibility for setting volatile configuration memory 222.

Memory management unit 220 constructs an Nmax-bit signal for a write operation, using a corresponding Nj-bit value to be written. More particularly, the Nj-bit value provides the most significant bits of the Nmax-bit signal, and the least significant bits of the Nmax-bit signal can be selected according to a convention implemented in memory management unit 220. For example, the least significant bits can be all zero, all one, or have a value that depends on the Nj-bit value and provides a maximum separation between the Nj-bit values.

The control circuit 216 for the selected memory array 210 enables operation of the write circuitry associated with the selected array. Control circuits 216 for unselected arrays disable the write circuitry in the unselected arrays. In the embodiment, of FIG. 2, the write circuit include a converter 214W that converts the Nmax-bit signal to an analog voltage, and an analog/multi-level write circuit 213W that programs the threshold voltage of a selected memory cell to a target threshold voltage corresponding to the analog voltage. The analog/multi-level write and read circuits 212 connected to the selected array generate the programming voltages necessary to program the selected memory cell to the target threshold voltage. Analog/multi-level read and write circuits are known in the art and described, for example, in U.S. Pat. No. 5,694,356, which is hereby incorporated by reference in its entirety. The particular type of analog/multi-level write circuit used is not critical to the invention, but generally, high accuracy is desired to allow up to $2^{Nmax}$ different threshold voltage levels.

When the write circuit has programmed the selected memory cell to the target threshold voltage, memory management unit 220 changes the address signal to select the next memory cell in the selected sector and retrieves the next Nj bits from data buffer 230. The write operation programs the newly selected memory cell to the threshold voltage corresponding to the next Nj-bit value. The write operation repeats until an Nj-bit value is written in the last memory cell of the selected sector or writing is otherwise complete. Memory management unit 220 then selects another sector for a write operation. If the new sector is in another array 210, memory management unit 220 changes the array select signal, reads configuration memory 222, and changes the bit limitation Nj if the number of bits stored per cell in the newly selected array differs from the number of bits per cell in the previously selected array. The writing of the sector typically begins when data buffer 230 contains enough data to fill the next data sector but alternatively can start whenever data buffer 230 contains the next Nj bits of data to be written.

For a read operation, memory management unit 220 again generates the array select signal and address signal to select an array, a sector of the selected array, and a memory cell in the selected sector. The control circuit 216 for the selected array 210 directs the associated write and read circuit 212 to read the threshold voltage of the selected memory cell. In the embodiment of FIG. 2, the read circuits include an analog/multi-level read circuit 213R and a converter 214R. Analog/multi-level read circuit 213R provides an analog signal to converter 214R representing the threshold voltage of the selected memory cell, and converter 214R outputs an Nmax-bit digital signal to the Nmax-bit wide data bus 252.

Memory management unit 220 receives the Nmax-bit digital signal and extracts Nj bits of data, for example, by ignoring or truncating the least significant bits, by rounding where the least significant bits represent a fraction, or by some other more complex conversion. Data buffer 230 collects the Nj data bits from the selected memory cell. The read operation repeats for each memory cell in the selected sector so that data buffer collects the block of data originally written into the selected sector. The data can then be read out externally via the I/O interface at high speed.

The described embodiment of memory 200 can be varied in many ways. Parallel or pipelined operations can take place among memory arrays 210 or within the same memory array 210. For example, instead of writing one Nj-bit data value at a time, multiple data values having the same or different sizes can be written in parallel using one array 210 or two more arrays 210 in parallel. Alternatively, memory management unit 220 operates arrays 210 in a pipeline fashion by starting a write or read operation in an array 210 before a previously started write or read operation in that or another memory array 210 is complete. Each parallel or pipelined write operation receives an Nmax-bit value where the number Nj of bits representing actual data depends on the capabilities of the target array 210 or more specifically on the values in configuration memory 222. Each read operation similarly provides an Nmax-bit value, where Nj bits are valid and used according to the location of the memory cell read. Parallel or pipelined write and read operations provide a higher bandwidth when recording or playing back a data stream.

Figure 3:
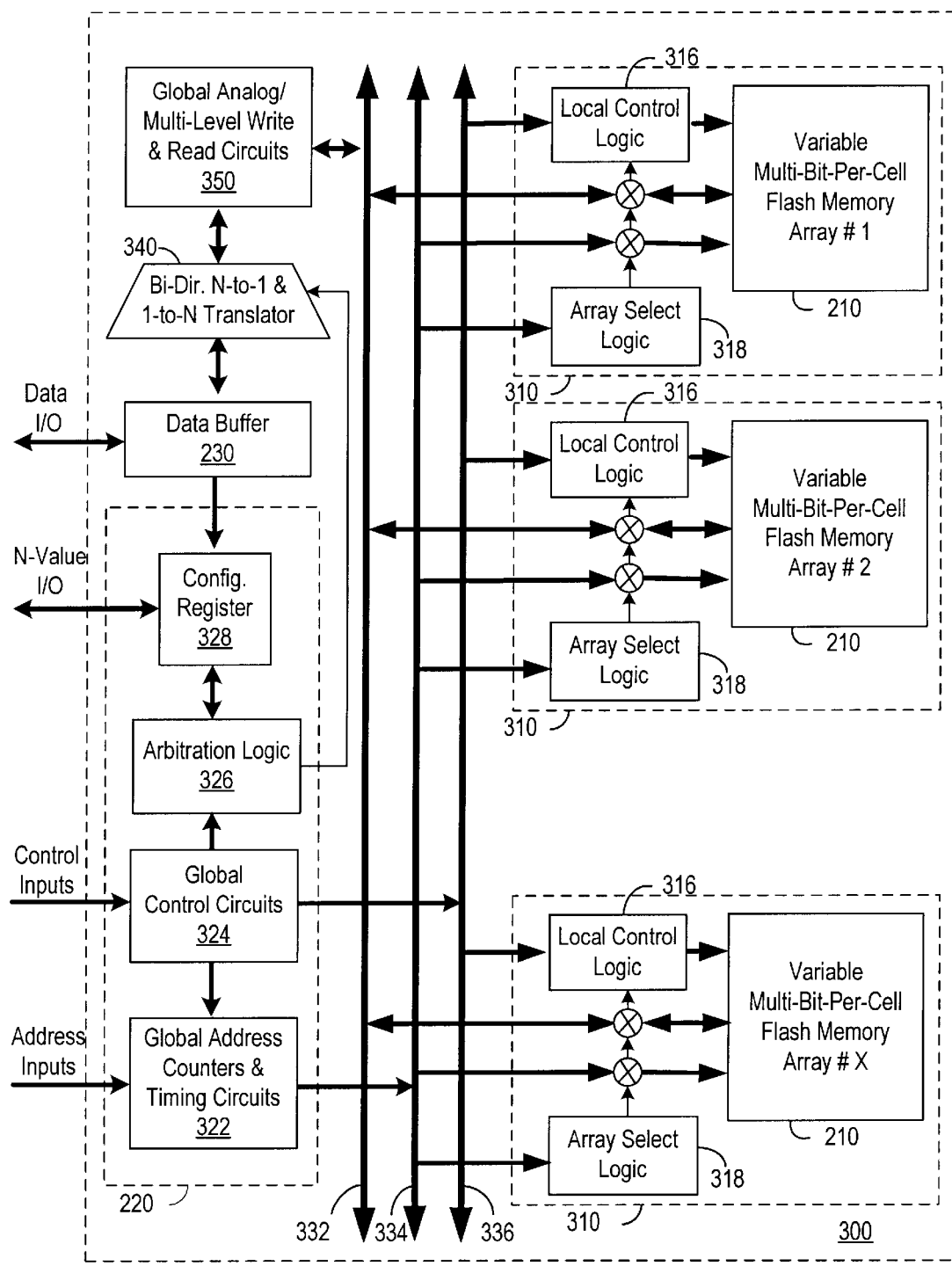
FIG. 3 shows a block diagram or a memory device in accordance with another embodiment of the invention.

FIG. 3 illustrates an embodiment of a memory 300 that reduces overhead by sharing a converter 340 and global analog/multi-level write and read circuits 350 among multiple memory units 310, each including a memory array 210. Additionally, memory units 310 further reduce overhead by sharing global control circuits 324. Global control circuits 324 generate internal control signals that govern chip operations including erase operations, write operations, read operations, charge pump operations, stand-by mode operations, and various test operations. A typical memory can have more than fifty internal control signals. Local control logic 316 for each array 210 receives global control signals and generates appropriate local control signals that depend on whether the associated array 210 is selected.

To write a data value in a selected memory cell, converter 340 fetches Nj bits from data buffer 230 where Nj is the number of bits that are stored per cell in the selected memory array 210. A configuration register 328 stores the set of values Nj. Converter 350 converts an Nj-bit value from data buffer 230 into an analog voltage representing the value to be written in the selected memory cell. Typically, the conversion depends on the number of bits stored per memory cell in the target array so that the memory array employs the full available range of threshold voltages. Converter 350 provides the analog voltage to the global analog/multi-level write and read circuits 350.

Global analog/multi-level read and write circuits 350 generate the voltages to be applied to the selected memory cell during a write operation. More particularly, global analog/multi-level read and write circuits 350 generate row and column line voltages required for programming, which changes the threshold voltage of the selected memory cell, and row and column line voltages used to verify that the selected memory cell has reached a threshold voltage representing the data value. During a write operation, a global bus 332 carries the row and column line voltages for use by any of memory units 310.

Global address bus 334 carries address signals from global address circuits 322 in memory management unit 220 to all of memory units 310. Part of the address signal is an array select signal. The array select decoder 318 in the selected memory unit 310 recognizes the array select signal and enables use of row and column addresses from global address bus 334 and program and verify voltages from global bus 332. Row and column decoders in the selected array 210 select a memory cell according to the row and column address and apply the row and column line voltages from global bus 332 to the selected memory cell.

Similarly, during a read of a selected memory cell, global address circuits 322 generate an address signal to identify the selected memory array and the selected memory cell. The array select decoder 318 enables the row and column address to reach the row and column decoders of the selected array and connects global write and read circuits 350 to the selected array 210. Global write and read circuits 350 generate an analog signal indicating threshold voltage of the selected memory cell, and apply the signal to converter 340. Converter 340 then converts the analog signal to an Nj-bit data value where Nj is the number of bits per cell stored in the selected array as indicated in configuration register 328. As for a write operation, arbitration logic 326 reads the value Nj from configuration register 328 and controls converter 340 accordingly. Data buffer 230 collects the data values from converter 340 for output in data units of a standard size.

FIG. 3 also illustrates an embodiment of memory management unit 220 that includes global address circuits 322, global control circuits 324, arbitration logic 326, and configuration register 328. Configuration register 328 stores a set of values Nj where index j runs over a range corresponding to arrays 210 in memory 300. For normal operation, the values Nj are from non-volatile memory and loaded into configuration register 328 during start up of memory 300. The non-volatile memory can be a ROM (not shown) or part of arrays 210 in memory 300. The values Nj can be stored in ROM, for example, by setting a fuse option in response to testing memory 300. Programming erasable programmable ROM such as Flash memory with the values Nj allows possible changes in the values that will allow memory 300 to continue to operate even if one or more array 210 becomes unable to store the number of bits that initial testing indicated.

External access to configuration register 328 allows a system's CPU or controller to examine and/or select the number of bits stored per memory cell in each of the arrays. The values Nj from ROM provide a rating of the capability to store information with a particular reliability. If desired, a system can operate memory at a higher data density but a lower than normal reliability, depending on a users selection. Alternatively, based on the value Nj from ROM, the system (or the user) can selectively allocate the memory array with the most appropriate (most effective) value Nk according to the nature of the data. For example, code or program storage, which requires absolute data integrity, could be stored in a memory array 210 rated for storing a large number Nj of bits but using only Nk bits per memory cell where Nk is less than Nj to maximize data integrity. Other types of data can choose a different approach. Further, external access to configuration register 328 allows testing of the arrays by setting the value Nj for an array, writing data to that array, and reading data from that array to determine whether there are any errors.

Global address circuits 322 receive an external address indicating the memory locations or sectors to be accessed (written or read). Address circuit 322 converts the external address to an internal address identifying a first sector or first memory cell storing data corresponding to the external address. A variety of systems for the conversion between external and internal addresses are possible. For example, memory manage management unit 220 can implement a file organization or a sector access organization similar to that employed in disk drives. The external address typically corresponds to a block of data or a data unit that is stored in several memory cells. Counters in global address circuit 322 increment (or otherwise change) the internal address as required for accessing each memory cell associated with the block. The number of memory cells accessed depends on the amount of data transferred and the number Nj of bits stored per memory cell.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A memory comprising:
   a plurality of memory arrays including a first memory array and a second memory array, the first memory array being configured to store N1 bits per memory cell, the second memory array being configured to store N2 bits per memory cell, where N2 is less than N1 and greater than zero;
   a data input/output interface; and
   a data buffer coupled between the input/output interface and the plurality of memory arrays, the data buffer collecting data read from or to be written to the plurality of memory cells.

2. The memory of claim 1, wherein:
   for an operation reading from the first memory array, the data buffer collects N1 bits of data from each memory cell read for subsequent output through the input/output interface; and
   for an operation reading from the second memory array, the data buffer collects N2 bits of data from each memory cell read for subsequent output through the input/output interface.

3. The memory of claim 1, wherein:
   for an operation writing to the first memory array, the data buffer provides N1 bits of data for each memory cell to which data is being written; and
   for an operation writing to the second memory array, the data buffer provides N2 bits of data for each memory cell to which data is being written.

4. The memory of claim 1, further comprising a register storing a plurality of values including N1 and N2, wherein each value stored in the register corresponds to one of the plurality of arrays and indicates a number bits stored per memory cell in the corresponding array.

5. The memory of claim 4, wherein the register is user-accessible for examination of the plurality of values.

6. The memory of claim 4, wherein the register is user-accessible for changing the plurality of values.

7. The memory of claim 4, wherein the register comprises non-volatile memory storing the plurality of values.

8. The memory of claim 1, further comprising a read circuit coupled to the second memory array, the read circuit generating an Nmax-bit value according to a threshold voltage of a selected memory cell in the second memory array, wherein Nmax is greater than N2.

9. A memory comprising:
   a plurality of memory units, each memory unit comprising:
      a memory array;
      a write circuit that receives an Nmax-bit value and programs a threshold voltage of a memory cell in the array, to a target level selected according to the Nmax-bit value; and
      a read circuit that generates an Nmax-bit value according to a threshold voltage of a memory cell being read;
   a global data bus coupled to provide Nmax-bit values to the write circuits and receive Nmax-bit values from the read circuits; and
   input/output circuitry coupled to the global data bus, the input/output circuitry selecting a number of bits on the global data bus that are actual data, the number of bits depending on which of the plurality of memory units is involved in a data transfer on the global data bus.

10. The memory of claim 9, further comprising a configuration register coupled to the input/output circuitry, the configuration register containing configuration values indicating for each memory unit, a number of data bits stored per memory cell in that memory unit.

11. The memory of claim 10 wherein the configuration register is user-accessible for examination of the configuration values.

12. The memory of claim 10 wherein the configuration register is user-accessible for changing of the configuration values.

13. The memory of claim 10, wherein the configuration register comprises non-volatile memory storing the configuration values.

14. A memory comprising:
   a plurality of memory units;
   a global write/read circuit coupled to the plurality of memory units to control writing to and reading from the plurality of memory units;
   input/output circuitry coupled to the global write/read circuit, the input/output circuitry selecting a number of bits of actual data transferred by a write or read operation, the number of bits depending on which of the plurality of memory units is the target of the write or read operation; and
   a converter coupled to the global write/read circuit, wherein
      the converter converts a first digital signal to an analog signal representing a value for a write operation that the global write/read circuit controls, the digital signal containing a number of data bits selected by the input/output circuitry; and
      the converter converts an analog signal from the global write/read circuit to a second digital signal, the second digital signal containing a number of data bits selected by the input/output circuitry.

15. A memory comprising:
   a plurality of memory units;
   a global write/read circuit coupled to the plurality of memory units to control writing to and reading from the plurality of memory units;
   input/output circuitry coupled to the global write/read circuit, the input/output circuitry selecting a number of bits of actual data transferred by a write or read operation, the number of bits depending on which of the plurality of memory units is the target of the write or read operation; and a configuration register coupled to the input/output circuitry, the configuration register containing configuration values indicating for each memory unit, a number of data bits stored per memory cell in that memory unit.

16. The memory of claim 15 wherein the configuration register is user-accessible for examination of the configuration values.

17. The memory of claim 15 wherein the configuration register is user-accessible for changing of the configuration values.

18. The memory of claim 15, wherein the configuration register comprises non-volatile memory storing the configuration values.

19. A method for using an integrated circuit memory, comprising:
    selecting a first memory array in the integrated circuit memory;
    identifying a number N1 of bits per cell for the first memory array;
    accessing a first selected memory cell in the first memory array, wherein the access of the first selected memory cell transfers N1 bits of data;
    selecting a second memory array in the integrated circuit memory;
    identifying a number N2 of bits per cell for the second memory array, wherein N2 differs from N1; and
    accessing a second selected memory cell in the second memory array, wherein the access of the second selected memory cell transfers N2 bits of data.

20. The method of claim 19, wherein:
    identifying the number N1 comprises reading the number N1 from a first register entry that corresponds to the first memory array; and
    identifying the number N2 comprises reading the number N2 from a second register entry that corresponds to the second memory array.

21. The method of claim 20, wherein the first and second register entries are in a volatile memory.

22. The method of claim 21, further comprising a start-up procedure for the memory, the start-up procedure comprising:
    reading the values N1 and N2 from non-volatile memory; and
    storing the numbers N1 and N2 in the volatile memory.

23. The method of claim 21, a user writing the numbers N1 and N2 to the volatile memory to select a storage density for the first and second memory units.

24. The method of claim 19, wherein:
    accessing the first selected memory cell comprises reading the first selected memory cell to determine an N1-bit value that corresponds to a threshold voltage of the first selected memory cell; and
    accessing the second selected memory cell comprises reading the second selected memory cell to determine an N2-bit value that corresponds to a threshold voltage of the second selected memory cell.

25. The method of claim 19, wherein:
    accessing the first selected memory cell comprises writing to the first selected memory cell to set a threshold voltage of the first selected memory cell to a level corresponding to an N1-bit value; and
    accessing the second selected memory cell comprises writing to the second selected memory cell to set a threshold voltage of the second selected memory cell to a level corresponding to an N2-bit value.

26. A method for using a non-volatile integrated circuit memory, comprising:
    configuring the non-volatile integrated circuit memory by writing a value N1 in a first register entry corresponding to a first memory unit in the non-volatile integrated circuit memory; and
    accessing a first selected memory cell in the first memory unit, wherein the value N1 indicates a number of data bits that the access transfers to or from the first selected memory cell.

27. The method of claim 26, further comprising:
    writing a value N2 in a second register entry corresponding to a second memory unit in the non-volatile integrated circuit memory; and
    accessing a second selected memory cell in the second memory unit, wherein the access of the second selected memory cell transfers N2 bits of data.

28. The method of claim 27, wherein N2 differs from N1.

29. The method of claim 26, wherein the configuring is performed during a start-up procedure for the non-volatile integrated circuit memory.

30. The method of claim 26, wherein the configuring is performed by inputting a signal that represents the value N1, into the non-volatile integrated circuit memory.

* * * * *